(12) United States Patent
Ishihara et al.

(10) Patent No.: US 8,735,965 B2
(45) Date of Patent: May 27, 2014

(54) NONVOLATILE SEMICONDUCTOR MEMORY DEVICE AND METHOD FOR MANUFACTURING SAME

(75) Inventors: Hanae Ishihara, Mie-ken (JP); Mitsuru Sato, Mie-ken (JP); Toru Matsuda, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 13/421,471

(22) Filed: Mar. 15, 2012

(65) Prior Publication Data

US 2013/0069139 A1 Mar. 21, 2013

(30) Foreign Application Priority Data

Sep. 15, 2011 (JP) ................. 2011-202402

(51) Int. Cl.
*H01L 29/792* (2006.01)

(52) U.S. Cl.
USPC .................. 257/324; 257/326; 257/E21.423; 257/E29.309

(58) Field of Classification Search
CPC ................... H01L 27/11582; H01L 27/11578; H01L 27/0688; H01L 21/8221; H01L 27/11568
USPC ................... 257/E29.309, 324, E21.423, 326
See application file for complete search history.

(56) References Cited

U.S. PATENT DOCUMENTS

| 7,936,004 | B2 | 5/2011 | Kito et al. | |
|---|---|---|---|---|
| 8,148,769 | B2 * | 4/2012 | Kito et al. | 257/321 |
| 2010/0207195 | A1 | 8/2010 | Fukuzumi et al. | |
| 2010/0213537 | A1 * | 8/2010 | Fukuzumi et al. | 257/326 |
| 2011/0031550 | A1 * | 2/2011 | Komori et al. | 257/324 |
| 2011/0062510 | A1 * | 3/2011 | Joo | 257/324 |
| 2011/0065270 | A1 * | 3/2011 | Shim et al. | 438/589 |
| 2011/0103153 | A1 * | 5/2011 | Katsumata et al. | 365/185.23 |
| 2013/0161726 | A1 * | 6/2013 | Kim et al. | 257/324 |
| 2013/0168752 | A1 * | 7/2013 | Kim et al. | 257/314 |

* cited by examiner

*Primary Examiner* — Julio J Maldonado
*Assistant Examiner* — Jaehwan Oh
(74) *Attorney, Agent, or Firm* — Oblon, Spivak, McClelland, Maier & Neustadt, L.L.P.

(57) ABSTRACT

According to one embodiment, a nonvolatile semiconductor memory device includes a substrate, an electrode layer provided above the substrate, a first insulating layer provided on the electrode layer, a stacked body provided on the insulating layer, a memory film, a channel body layer, a channel body connecting portion and a second insulating layer. The stacked body has a plurality of conductive layers and a plurality of insulating film alternately stacked on each other. The memory film is provided on a sidewall of each of a pair of holes penetrating the stacked body in a direction of stacking the stacked body. The channel body layer is provided on an inner side of the memory film in each of the pair of the holes.

11 Claims, 12 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-202402, filed on Sep. 15, 2011; the entire contents of which are incorporated herein by reference.

FIELD

Embodiments described herein relate generally to a nonvolatile semiconductor memory device and a method for manufacturing the same.

BACKGROUND

There is a memory device in which a memory hole is formed in a stacked body, in which an electrode layer functioning as a control gate in a memory cell and an insulating layer are alternately stacked on each other in multiple layers, a charge storage film is formed on the sidewall of the memory hole, and a channel body layer is then provided in the memory hole, thereby three-dimensionally arranging memory cells.

In this type of memory device, there is a U-shaped memory string structure having a pair of columns extending in a direction of stacking a stacked body including a plurality of electrode layers and a joining portion buried in a back gate and connecting the pair of the columns to each other.

Before forming the stacked body including the electrode layers, a recess (a space) is formed in a base layer to be the back gate, and a sacrificial film is buried in the recess. After this burying, the stacked body including the electrode layers is formed on the base layer, a hole for the column is formed, and the sacrificial film in the recess is removed through the hole by etching. After this etching, a charge storage film and a channel body layer are formed in the hole and the recess for forming a nonvolatile semiconductor memory device. In this type of nonvolatile semiconductor memory device, the number of stacked layers of the stacked body tends to increase more and more. Thus, an increase in the number of stacked layers of the stacked body sometimes causes the parasitic resistance of the channel body layer to increase. Desirably, the parasitic resistance of the channel body layer is more reduced.

DETAILED DESCRIPTION

Figure 1:
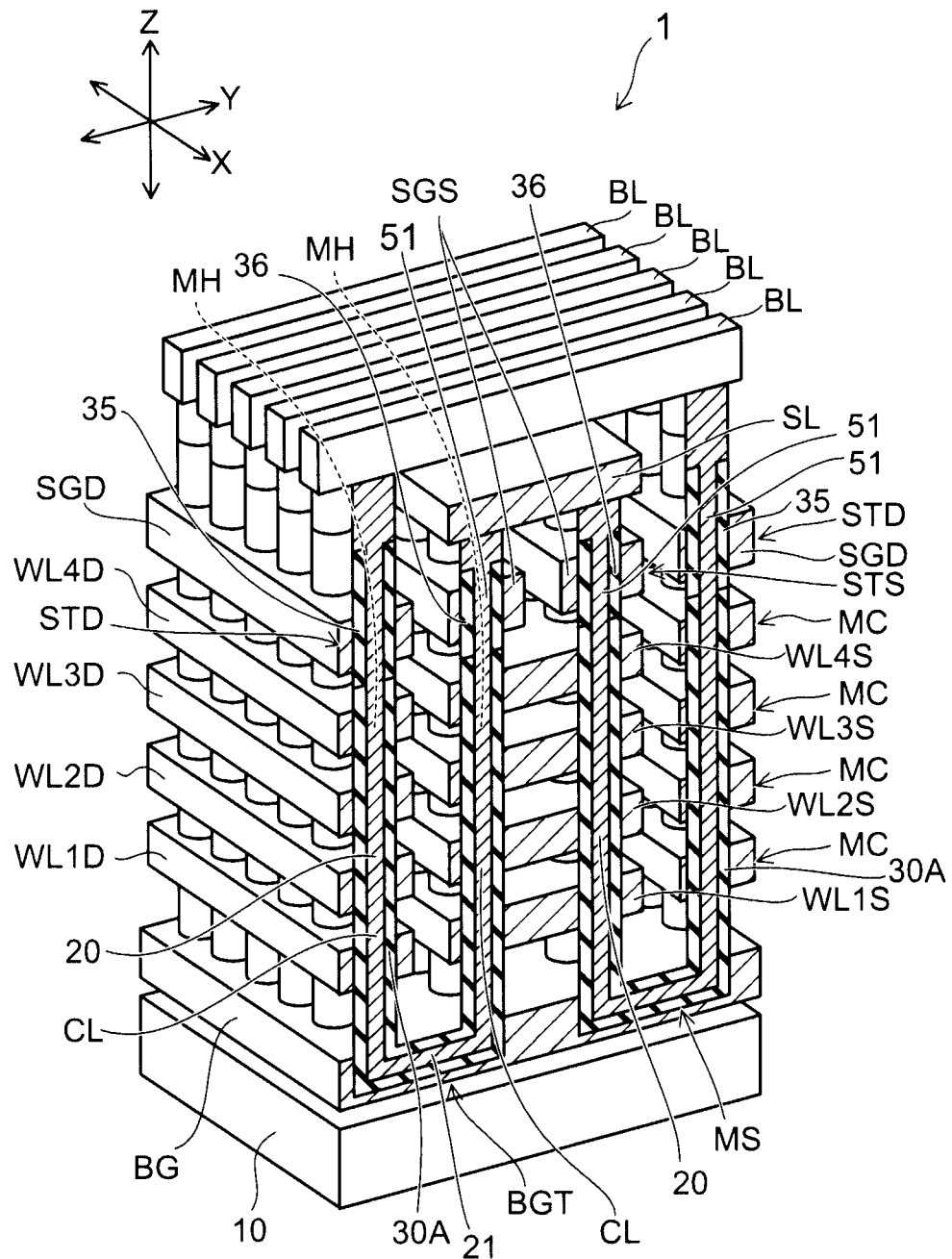
FIG. 1 is a schematic perspective view illustrating a memory cell array of a nonvolatile semiconductor memory device according to a first embodiment.

In general, according to one embodiment, a nonvolatile semiconductor memory device includes a substrate, an electrode layer provided above the substrate, a first insulating layer provided on the electrode layer, a stacked body provided on the insulating layer, a memory film, a channel body layer, a channel body connecting portion and a second insulating layer. The stacked body has a plurality of conductive layers and a plurality of insulating film alternately stacked on each other. The memory film is provided on a sidewall of each of a pair of holes penetrating the stacked body in a direction of stacking the stacked body. The channel body layer is provided on an inner side of the memory film in each of the pair of the holes. The channel body connecting portion is formed so as to be buried in the electrode layer and provided so as to join a lower portion in the pair of the holes. The second insulating layer is provided between the channel body connecting portion and the stacked body. The film thickness of the second insulating layer is thicker than the film thickness of the first insulating layer.

According to another embodiment, a method is disclosed for manufacturing a nonvolatile semiconductor memory device. The method can form an electrode layer on a base layer. The method can form a first insulating layer on the electrode layer. The method can selectively etch a front surface of the electrode layer through the first insulating layer and forming a plurality of recesses from the front surface of the electrode layer to an inside thereof. The plurality of recesses is arranged in a first direction nearly parallel with a major surface of the electrode layer and in a second direction nearly parallel with the major surface of the electrode layer and almost vertical to the first direction. The method can form a sacrificial layer in each of the plurality of recesses. The method can form a groove from a front surface of the sacrificial layer to an inside thereof and from the front surface of the electrode layer to the inside thereof in a portion where the sacrificial layer is not provided. The groove is deeper than a thickness of the first insulating layer and extends in the first direction. The method can form a second insulating layer in the groove. The method can form a stacked body including a plurality of conductive layers on the first insulating layer, the sacrificial layer, and the second insulating layer. The method can form a slit extending in the first direction and reaching the second insulating layer from a front surface of the stacked body and a pair of holes reaching the sacrificial layer from the front surface of the stacked body. The method can remove the sacrificial layer through the pair of the holes and form a space in the electrode layer. The space is connected to a lower end of each of the pair of the holes. The method can form a fourth insulating layer in the slit, form a memory film on a sidewall of each of the pair of the holes, and form a third insulating layer on an inner wall of the space. The method can form a channel body layer on an inner side of the memory film formed in each of the pair of the holes and on an inner side of the third insulating layer formed on the inner wall of the space.

Various embodiments will be described hereinafter with reference to the accompanying drawings.

Hereinafter, embodiments of the invention will now be described in detail with reference to the drawings. In the following explanation, the same components are designated like reference numerals, and the explanation of components already explained is omitted appropriately.

First Embodiment

First, the outline of a nonvolatile semiconductor memory device according to a first embodiment will be described.

FIG. 1 is a schematic perspective view illustrating a memory cell array of the nonvolatile semiconductor memory device according to the first embodiment.

In FIG. 1, to make the drawing seen easily, insulating portions other than insulating films formed on the inner wall of a memory hole MH are omitted in the drawing.

The insulating portions will be described with reference to FIG. 7B that is a schematic cross sectional view illustrating the memory cell array.

Figure 2:
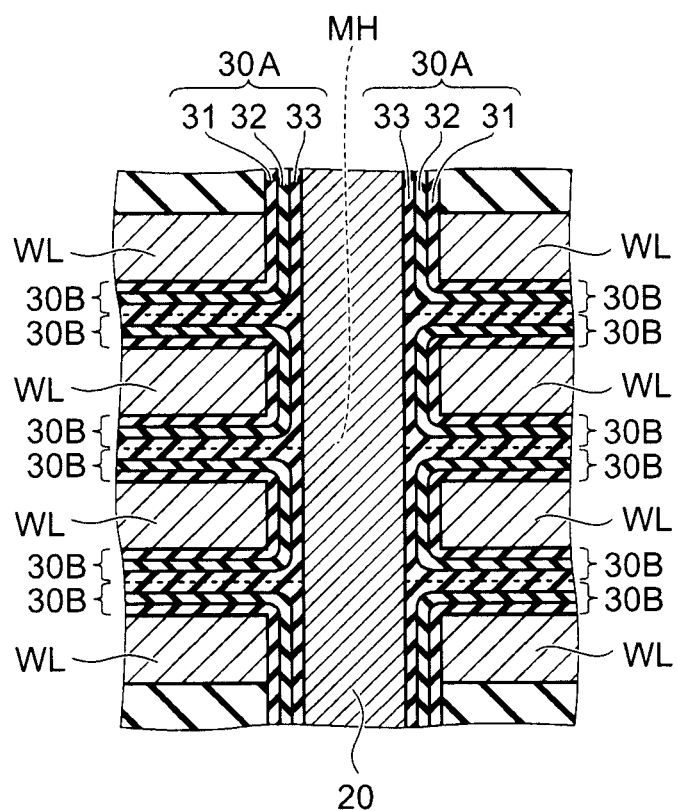
FIG. 2 is an enlarged cross-sectional view illustrating a portion provided with a memory cell shown in FIG. 1.

FIG. 2 is an enlarged cross-sectional view illustrating a portion provided with a memory cell shown in FIG. 1.

In FIG. 1, for convenience of explanation, an XYZ orthogonal coordinate system is introduced. In this coordinate system, an X-direction and a Y-direction are two directions parallel with the major surface of a substrate 10 and orthogonal to each other, and a Z-direction is a direction orthogonal to the X-direction and the Y-direction.

In a nonvolatile semiconductor memory device 1, a back gate BG is provided above the substrate 10 through an insulating layer, not shown. The substrate 10 including this insulating layer is referred to as a base layer. An active device such as a transistor and a passive device such as a resistor and a capacitor are provided in the substrate 10. The back gate BG is a silicon (Si) layer doped with an impurity element and having electrical conductivity, for example. In FIG. 7B, a semiconductor layer (a boron-doped silicon layer) 11 corresponds to the back gate BG. The structure near this back gate BG will be described in detail with reference to other drawings.

A plurality of insulating layers 30B (see FIG. 2) and a plurality of electrode layers WL1D, WL2D, WL3D, WL4D, WL1S, WL2S, WL3S, and WL4S are alternately stacked on each other on the back gate BG.

The electrode layer WL1D and the electrode layer WL1S are provided at the same level, expressing the first lower electrode layer from below. The electrode layer WL2D and the electrode layer WL2S are provided at the same level, expressing the second lower electrode layer from below. The electrode layer WL3D and the electrode layer WL3S are provided at the same level, expressing the third lower electrode layer from below. The electrode layer WL4D and the electrode layer WL4S are provided at the same level, expressing the fourth lower electrode layer from below.

The electrode layer WL1D and the electrode layer WL1S are separated from each other in the Y-direction. The electrode layer WL2D and the electrode layer WL2S are separated from each other in the Y-direction. The electrode layer WL3D and the electrode layer WL3S are separated from each other in the Y-direction. The electrode layer WL4D and the electrode layer WL4S are separated from each other in the Y-direction.

An insulating layer 30D shown in FIG. 7 is provided between the electrode layer WL1D and the electrode layer WL1S, between the electrode layer WL2D and the electrode layer WL2S, between the electrode layer WL3D and the electrode layer WL3S, and between the electrode layer WL4D and the electrode the layer WL4S.

The electrode layers WL1D, WL2D, WL3D, and WL4D are provided between the back gate BG and a drain-side select gate SGD. The electrode layers WL1S, WL2S, WL3S, and WL4S are provided between the back gate BG and a source-side select gate SGS.

The number of the electrode layers WL1D, WL2D, WL3D, WL4D, WL1S, WL2S, WL3S, and WL4S is optional, not limited to four layers illustrated in FIG. 1. In the explanation below, the electrode layers WL1D, WL2D, WL3D, WL4D, WL1S, WL2S, WL3S, and WL4S are sometimes simply expressed as an electrode layer WL.

The electrode layer WL is a silicon layer doped with an impurity and having electrical conductivity, for example. The insulating layer 30B has an ONO structure, for example, described later.

The drain-side select gate SGD is provided on the electrode layer WL4D through an insulating layer, not shown. The drain-side select gate SGD is a silicon layer doped with an impurity and having electrical conductivity, for example.

The source-side select gate SGS is provided on the electrode layer WL4S through an insulating layer, not shown. The source-side select gate SGS is a silicon layer doped with an impurity and having electrical conductivity, for example.

The drain-side select gate SGD and the source-side select gate SGS are separated from each other in the Y-direction. In the explanation below, the drain-side select gate SGD and the source-side select gate SGS are sometimes simply expressed as a select gate SG, not distinguished from each other.

A source line SL is provided on the source-side select gate SGS through an insulating layer, not shown. The source line SL is a metal layer, or a silicon layer doped with an impurity and having electrical conductivity.

A plurality of bit lines BL are provided on the drain-side select gate SGD and the source line SL through an insulating layer, not shown. The bit lines BL extend in the Y-direction.

A plurality of U-shaped memory holes MH are formed in the back gate BG and in a stacked body on this back gate BG. For example, the electrode layers WL1D to WL4D and the drain-side select gate SGD are formed with a hole penetrating therethrough and extending in the Z-direction. The electrode layers WL1S to WL4S and the source-side select gate SGS are formed with a hole penetrating therethrough and extending in the Z-direction. A pair of the holes extending in the Z-direction are connected to each other through a recess (a space) formed in the back gate BG, and constituting the U-shaped memory hole MH.

A channel body layer 20 is provided in a U-shape in the memory hole MH. The channel body layer 20 is a silicon layer, for example. A memory film 30A is provided between the channel body layer 20 and the inner wall of the memory hole MH.

A gate insulating film 35 is provided between a channel body layer 51 connected to the channel body layer 20 and the drain-side select gate SGD. The channel body layer 51 is a silicon layer, for example. A gate insulating film 36 is provided between the channel body layer 51 and the source-side select gate SGS.

It is noted that the structure is not limited to the structure in which the memory hole MH is entirely buried with the channel body layer 20, and such a structure may be possible in which the channel body layer 20 is formed in such a way that a cavity is left on the center axis side of the memory hole MH and an insulator is buried in the cavity on the inner side of the channel body layer 20.

The memory film 30A has an ONO (Oxide-Nitride-Oxide) structure in which a silicon nitride film is sandwiched between a pair of silicon oxide films, for example. As shown in FIG. 2, an insulating film 31, a charge storage film 32, and an insulating film 33 are provided between the electrode layers WL and the channel body layer 20 in turn from the electrode layer WL side. The insulating film 31 contacts with the electrode layer WL, the insulating film 33 contacts with the channel body layer 20, and the charge storage film 32 is provided between the insulating film 31 and the insulating film 33. Two insulating layers 30B are provided between the electrode layers WL.

The channel body layer 20 functions as a channel in the transistor constituting the memory cell, the electrode layer WL functions as a control gate, and the charge storage film 32 functions as a data storage layer to store electric charges injected from the channel body layer 20. Namely, a memory cell MC is formed at the intersecting portion between the channel body layer 20 and the electrode layers WL, in a structure in which the control gate surrounds the channel.

The nonvolatile semiconductor memory device 1 according to the first embodiment is a nonvolatile semiconductor memory device that can electrically freely erase and write data and can hold the stored content even after turning off a power supply.

The memory cell MC is a memory cell in a charge trap structure, for example. The charge storage film 32 has many traps to trap electric charges (electrons), which is a silicon nitride film, for example. The insulating film 33 is a silicon oxide film, for example, and becomes a potential barrier in injecting electric charges from the channel body layer 20 to the charge storage film 32, or when electric charges stored in the charge storage film 32 spread to the channel body layer 20. The insulating film 31 is a silicon oxide film, for example, and prevents electric charges stored in the charge storage film 32 from spreading to the electrode layer WL.

The drain-side select gate SGD, the channel body layer 20, and the gate insulating film 35 therebetween constitute a drain-side select transistor STD. The channel body layer 20 above the drain-side select transistor STD is connected to the bit line BL.

The source-side select gate SGS, the channel body layer 51, and the gate insulating film 36 therebetween constitute a source-side select transistor STS. The channel body layer 51 above the source-side select transistor STS is connected to the source line SL.

The back gate BG, the channel body layer 20 provided in this back gate BG, and the memory film 30A constitute a back gate transistor BGT.

The memory cell MC having the electrode layers WL4D to WL1D as the control gate is provided in multiple numbers between the drain-side select transistor STD and the back gate transistor BGT. Similarly, the memory cell MC having the electrode layers WL1S to WL4S as the control gate is provided in multiple numbers also between the back gate transistor BGT and the source-side select transistor STS.

The plurality of memory cells MC, the drain-side select transistor STD, the back gate transistor BGT, and the source-side select transistor STS are connected in series through the channel body layer for constituting a single U-shaped memory string MS.

A single memory string MS has a pair of columns CL extending in a direction of stacking the stacked body including the plurality of electrode layers WL and has a joining portion 21 buried in the back gate BG and joining the pair of the columns CL to each other. The memory string MS is arranged in multiple numbers in the X-direction and the Y-direction, so that the plurality of memory cells are three-dimensionally provided in the X-direction, the Y-direction, and the Z-direction.

The plurality of memory strings MS are provided in a memory cell array region of the substrate 10. A peripheral circuit to control the memory cell array is provided around, for example, the memory cell array region in the substrate 10.

Figure 3A:
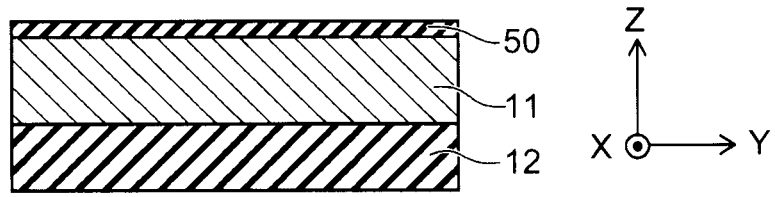
FIG. 3A to FIG. 3C are schematic cross sectional views illustrative of the manufacture process steps of the nonvolatile semiconductor memory device according to the first embodiment.
Figure 3B:
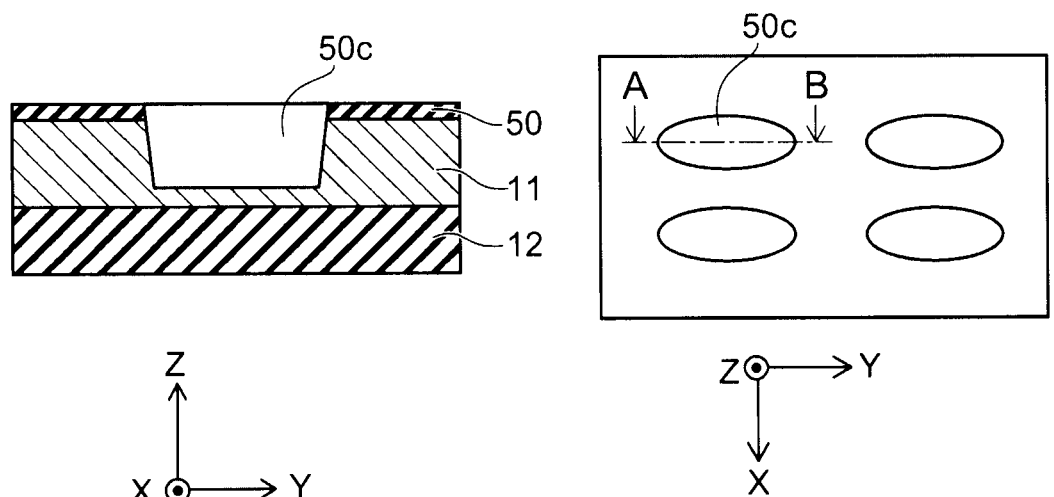
Figure 3C:
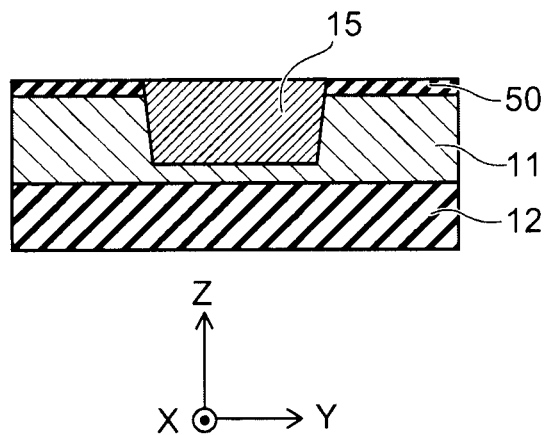
Figure 4A:
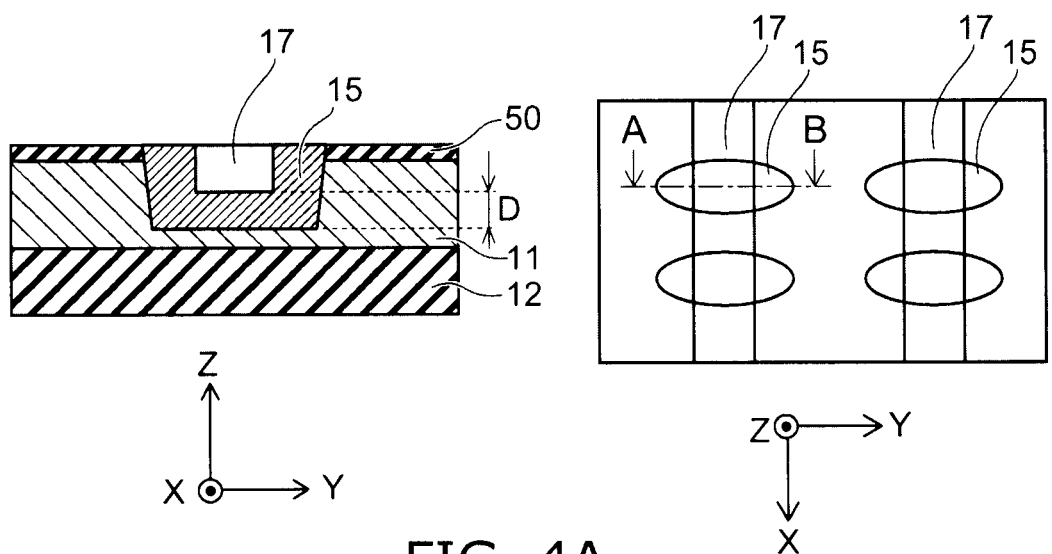
FIG. 4A and FIG. 4B are schematic cross sectional views illustrative of the manufacture process steps of the nonvolatile semiconductor memory device according to the first embodiment.

FIG. 3A, FIG. 3B, FIG. 3C, FIG. 4A, FIG. 4B, FIG. 5A, FIG. 5B, FIG. 6A, FIG. 6B, FIG. 7A and FIG. 7B are schematic cross sectional views illustrative of the manufacture process steps of the nonvolatile semiconductor memory device according to the first embodiment. FIG. 3B and FIG. 4A show a top schematic view in addition to the schematic cross sectional view.

First, as shown in FIG. 3A, the semiconductor layer 11 containing an impurity element is formed on a base layer 12. The semiconductor layer 11 is a boron-doped silicon layer, for example. This boron-doped silicon layer is to be the back gate BG. The base layer 12 has a transistor, an interconnection, an interlayer insulating film, or the like of the peripheral circuit to control the memory cell, for example.

Subsequently, an insulating layer 50 is formed on the semiconductor layer 11. The insulating layer 50 is formed by CVD (Chemical Vapor Deposition) using TEOS (tetraethoxysilane), for example, for a raw material.

Subsequently, as shown in FIG. 3B, the front surface of the semiconductor layer 11 is selectively etched through the insulating layer 50. Here, a schematic cross sectional view is shown on the left side of FIG. 3B, and a top schematic view is shown on the right side of FIG. 3B. The schematic cross sectional view in FIG. 3B is a cross-sectional view at a position along an A-B line in the top schematic view.

For example, a plurality of recesses 50c are formed from the front surface of the semiconductor layer 11 to the inside thereof by photolithography and RIE (Reactive Ion Etching). Each of the plurality of recesses 50c is formed so as to be arranged in the X-direction (in the first direction) nearly parallel with the major surface (for example, the top surface or the lower surface) of the semiconductor layer 11 and in the Y-direction (in the second direction) nearly parallel with the major surface of the semiconductor layer 11 and almost vertical to the X-direction. A position at which the recess 50c is formed corresponds to the position of the joining portion 21 to join the lower end of the memory hole MH to the semiconductor layer 11. When seeing the recess 50c from the Z-direction (the third direction), the appearance is an ellipse, for example.

Subsequently, as shown in FIG. 3C, a sacrificial layer 15 is formed in each of the plurality of recesses 50c. The sacrificial layer 15 is a non-doped silicon layer, or a silicon nitride layer. The excess portion of the sacrificial layer 15 is removed by etch back as necessary, for matching the top surface of the sacrificial layer 15 with the top surface of the insulating layer 50.

Subsequently, as shown in FIG. 4A, a plurality of grooves 17 extending in the X-direction are formed from the front surfaces of the semiconductor layer 11 and the sacrificial layer 15 to the insides thereof by photolithography and RIE. Here, a schematic cross sectional view is shown on the left side of FIG. 4A, and a top schematic view is shown on the right side of FIG. 4A. The schematic cross sectional view in FIG. 4A is a cross-sectional view at a position along an A-B line in the top schematic view.

For example, the groove 17 is formed from the front surface of the sacrificial layer 15 to the inside thereof and from the front surface of the semiconductor layer 11 to the inside thereof in a portion where the sacrificial layer 15 is not provided. The depth of the formed groove 17 is deeper than the thickness of the insulating layer 50. The groove 17 extends in the X-direction (the first direction). The groove 17 is positioned at almost the center of a region where the joining portion 21 is formed.

Figure 4B:
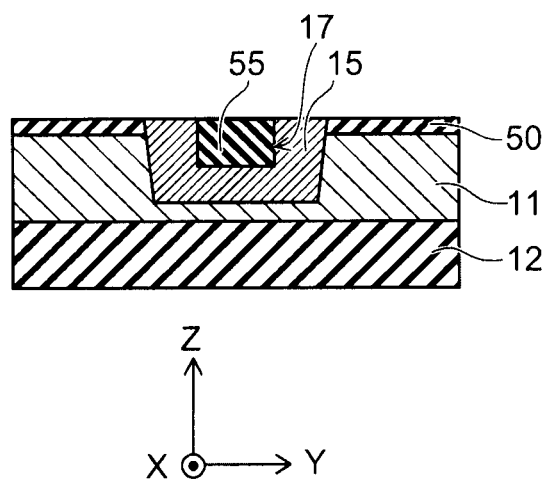

Subsequently, as shown in FIG. 4B, an insulating layer 55 to function as a stopper layer is formed in the groove 17. The material of the insulating layer 55 is a silicon oxide ($SiO_2$), for example. The excess portion of the insulating layer 55 is removed by etch back, CMP (Chemical Mechanical Polishing), or the like, and the front surface of the insulating layer 50, the front surface of the sacrificial layer 15, and the front surface of the insulating layer 55 are made almost flush.

Figure 5A:
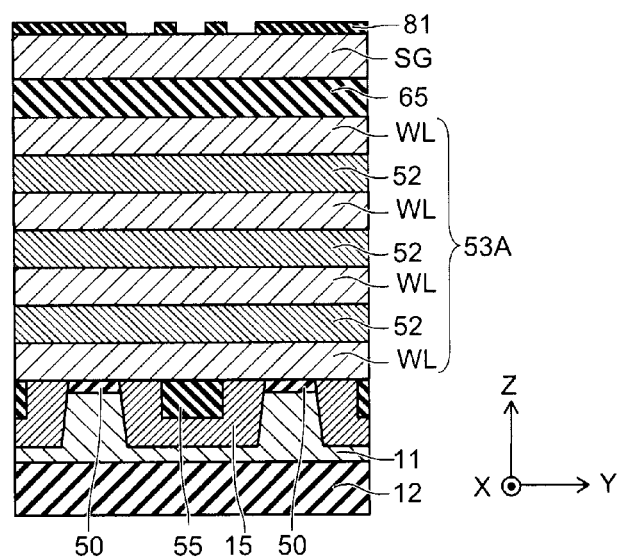
FIG. 5A and FIG. 5B are schematic cross sectional views illustrative of the manufacture process steps of the nonvolatile semiconductor memory device according to the first embodiment.

Subsequently, as shown in FIG. 5A, a stacked body 53A including the plurality of electrode layers WL is formed on the insulating layer 50, the sacrificial layer 15, and the insulating layer 55.

The stacked body 53A has an etched layer 52 between the plurality of electrode layers WL. The stacked body 53A is a stacked body having the electrode layer WL and the etched layer 52 stacked in multiple layers. The electrode layer WL is a boron-doped silicon layer, for example. The electrode layer WL has electrical conductivity enough for a gate electrode. The etched layer 52 is a non-doped silicon layer.

An interlayer insulating film 65 is formed on the stacked body 53A, and the select gate SG is formed on the interlayer insulating film 65. Subsequently, a mask pattern 81 formed of a silicon oxide film is formed on the select gate SG.

Figure 5B:
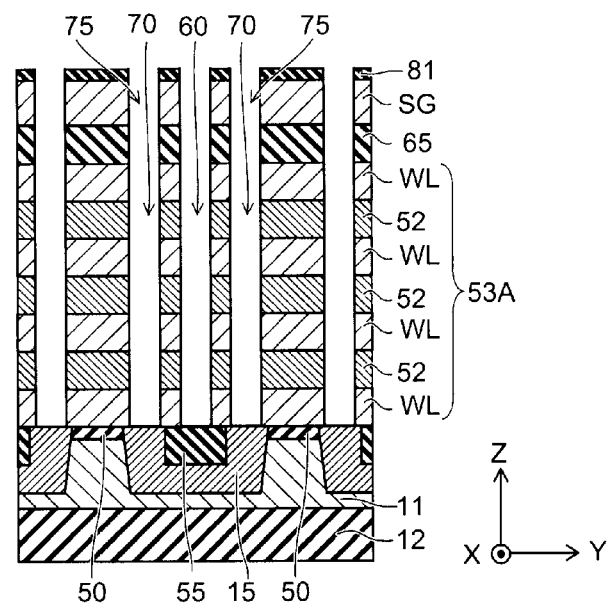

Subsequently, as shown in FIG. 5B, the following is formed: a slit 60 extending in the X-direction and reaching each insulating layer 55 from the front surface of the stacked body 53A; a pair of holes 70 reaching the sacrificial layer 15 from the front surface of the stacked body 53A; and a hole 75 connected to each of the pair of the holes 70 in the upper part of the stacked body 53A.

The select gate SG exposed from the mask pattern 81, the interlayer insulating film 65, and the stacked body 53A are removed by dry etching such as RIE, for example, for forming the slit 60, the pair of the holes 70, and the hole 75 connected to each of the pair of the holes 70.

The thickness of the insulating layer 55 before the slit 60 reaches the insulating layer 55 is thicker than the thickness of the insulating layer 50. In forming the slit 60 and the pair of the holes 70 at the same time, the insulating layer 55 functions as an etch stop layer.

In the first embodiment, the pair of the holes 70 reach the sacrificial layer 15 when forming the slit 60 and the pair of the holes 70 at the same time. However, the lower end of the slit 60 is stopped in the insulating layer 55 because of the existence of the insulating layer 55. Thus, the sacrificial layer 15 is not separated by the slit 60. The slit 60 and the hole 70 are not connected to each other after removing the sacrificial layer 15, described later.

Figure 6A:
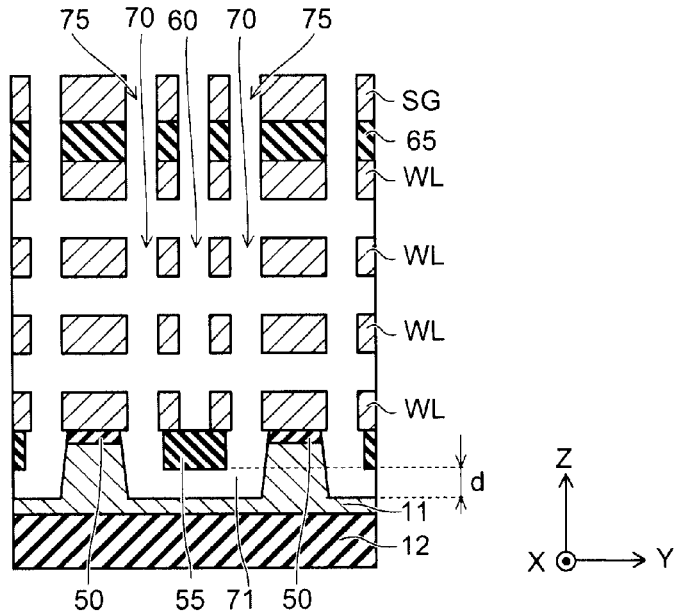
FIG. 6A and FIG. 6B are schematic cross sectional views illustrative of the manufacture process steps of the nonvolatile semiconductor memory device according to the first embodiment.

Subsequently, as shown in FIG. 6A, the sacrificial layer 15 and the etched layer 52 are removed through the pair of the holes 70 and the holes 75, and a space 71 connected to the lower end of each of the pair of the holes 70 is formed in the semiconductor layer 11. The sacrificial layer 15 and the etched layer 52 are removed by dissolving the sacrificial layer 15 and the etched layer 52 with an alkaline liquid solution, for example. The description of a support unit that supports each layer so as to prevent a stacked structure from collapsing in the removal process steps is omitted in FIG. 6A.

Figure 6B:
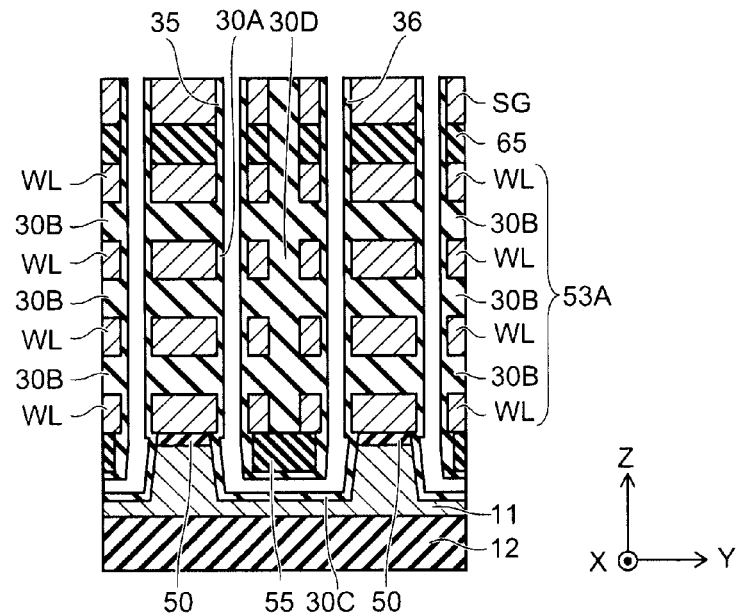

Subsequently, as shown in FIG. 6B, the insulating layer 30D is formed in the slit 60. The memory film 30A is formed on the sidewall of each of the pair of the holes 70. The insulating layer 30B is formed between the electrode layers WL. The insulating layer 30C is formed on the inner wall of the space 71.

The memory film 30A, the insulating layer 30B, the insulating layer 30C, and the insulating layer 30D are collectively formed using the same raw material. Thus, the insulating layers 30B, 30C, and 30D have the same component as the component of the memory film 30A buried in the hole 70. In this stage, the gate insulating films 35 and 36 are formed on the inner side of the hole 75.

It is noted that a hole width d of the space 71 shown in FIG. 6A is adjusted beforehand to the width to the extent that the hole of the space 71 is not clogged with the insulating layer 30C in forming the insulating layer 30C. The insulating layer 30C does not block the inside of the memory hole MH by adjusting the hole width d beforehand in such a way that the hole width d satisfies Equation (1) below, for example.

$$d > (\text{the thickness of the insulating layer } 30C + \text{the channel body layer } 20) \times 2 \qquad (1)$$

Figure 7A:
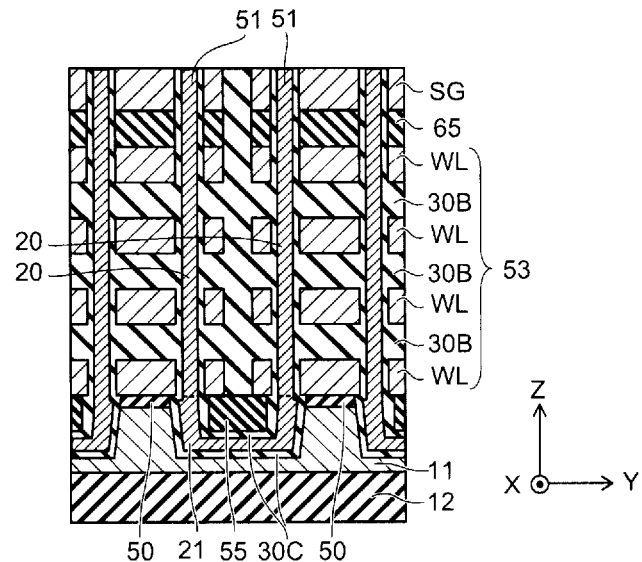
FIG. 7A and FIG. 7B are schematic cross sectional views illustrative of the manufacture process steps of the nonvolatile semiconductor memory device according to the first embodiment.

Subsequently, as shown in FIG. 7A, the channel body layer 20 is formed on the inner side of the memory film 30A formed on the sidewall of each of the pair of the holes 70 and on the inner side of the insulating layer 30C formed on the inner wall of the space 71. Here, the joining portion 21 is defined as a portion of the channel body layer formed on the inner side of the insulating layer 30C on the underside of a stacked body 53.

At the same time when forming the channel body layer 20, the channel body layer 51 is formed on the inner sides of the gate insulating films 35 and 36 formed on the sidewall of each of the holes 75. The channel body layer 20 and the channel body layer 51 are formed as connected to each other.

Figure 7B:
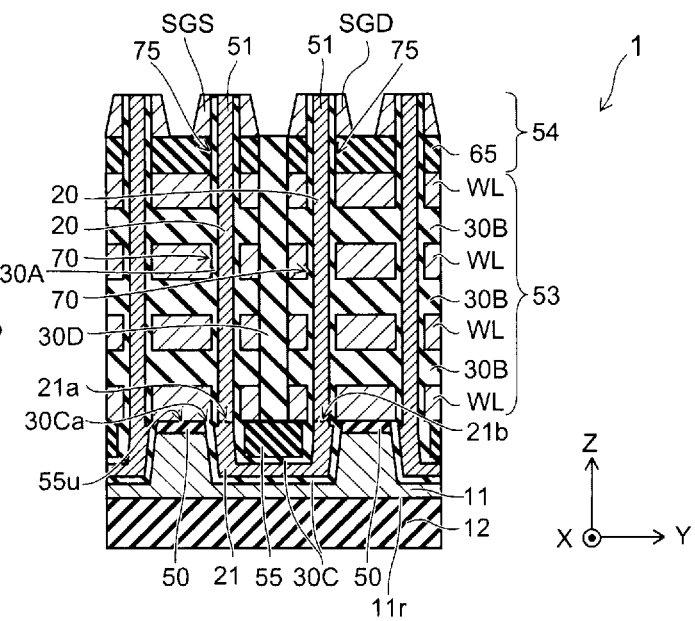

Subsequently, as shown in FIG. 7B, the select gate SG is processed by photolithography and dry etching for forming the drain-side select gate SGD and the source-side select gate SGS. After this formation, other members (a contact electrode, an interconnection, or the like) are formed, and thus the nonvolatile semiconductor memory device 1 is formed.

The nonvolatile semiconductor memory device 1 shown in FIG. 7B has the semiconductor layer 11 and the insulating layer 30C. The insulating layer 30C is buried from the front surface of the semiconductor layer 11 to the inside thereof, and the insulating layer 55 is provided on the front surface. The top surface of the semiconductor layer 11 is positioned higher than the bottom face of the insulating layer 55. The insulating layer 50 is provided on the front surface of the semiconductor layer 11 where the insulating layer 30C is not provided.

The stacked body 53 (the first stacked body) having the plurality of electrode layers WL and the plurality of insulating layers 30B alternately stacked on each other is provided on the insulating layer 30C and the insulating layer 50. The existence of the insulating layer 30B ensures the insulation between the electrode layers WL provided above and below the insulating layer 30B.

The memory film 30A is provided on the sidewall of each of the pair of the holes 70 (first holes) penetrating the stacked body 53 in the direction of stacking the stacked body 53 and reaching the insulating layer 30C. The channel body layer 20 (a first channel body layer) is provided on the inner side of the memory film 30A in each of the pair of the holes 70.

A stacked body 54 (a second stacked body) is provided on the stacked body 53. The stacked body 54 has the interlayer insulating film 65 and the select gate SG provided on the interlayer insulating film 65.

The gate insulating films 35 and 36 are provided on the sidewall of the hole 75 (a second hole) communicating with the top end of each of the pair of the holes 70 and penetrating the stacked body 54 in the direction of stacking the stacked body 54.

The channel body layer 51 (a second channel body layer) connected to the channel body layer 20 is provided on the inner sides of the gate insulating films 35 and 36 in the hole 75.

The joining portion 21 is provided on the underside of the stacked body 53. The joining portion 21 exists in the insulating layer 30C and is connected to the lower end of the channel body layer 20 provided in each of the pair of the holes 70. The component of the joining portion 21 is the same as the component of the channel body layer 20.

The nonvolatile semiconductor memory device 1 is provided with the insulating layer 30D sandwiched between the pair of the holes 70 and penetrating the stacked body 53 from the front surface of the stacked body 53. The insulating layer 30D reaches the insulating layer 55. The insulating layer 30D does not reach the insulating layer 30C because of the existence of the insulating layer 55.

In the nonvolatile semiconductor memory device 1, the heights of one end 21a and an other end 21b of the joining portion 21 from a back surface 11r of the semiconductor layer 11 are almost the same as the height of a top surface 50u of the insulating layer 50 from the back surface 11r of the semiconductor layer 11. The one end 21a and the other end 21b of the joining portion 21 are positioned higher than the bottom face of the insulating layer 55. The height of a top surface 30Ca of the insulating layer 30C from the back surface 11r of the semiconductor layer 11 is almost the same as the height of the top surface 50u of the insulating layer 50 from the back surface 11r of the semiconductor layer 11. The thickness of the insulating layer 55 is thicker than the thickness of the insulating layer 50.

Before explaining the effect exerted from the first embodiment, the manufacture process steps of a nonvolatile semiconductor memory device according to a reference sample will be described.

Figure 8A:
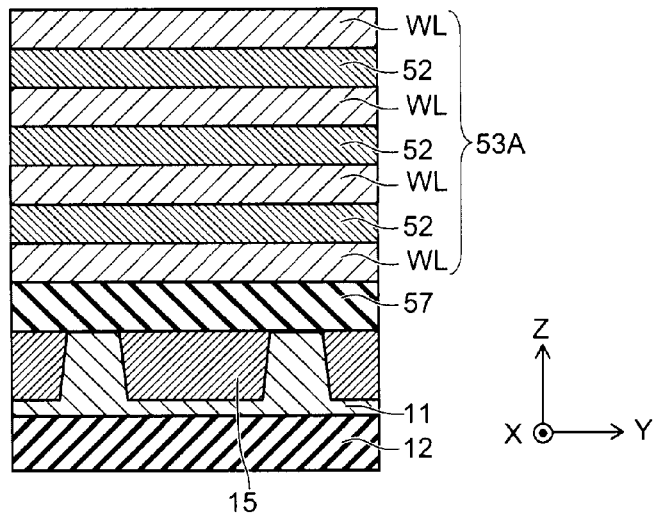
FIG. 8A and FIG. 8B are schematic cross sectional views illustrative of the manufacture process steps of the nonvolatile semiconductor memory device according to the reference sample.
Figure 8B:
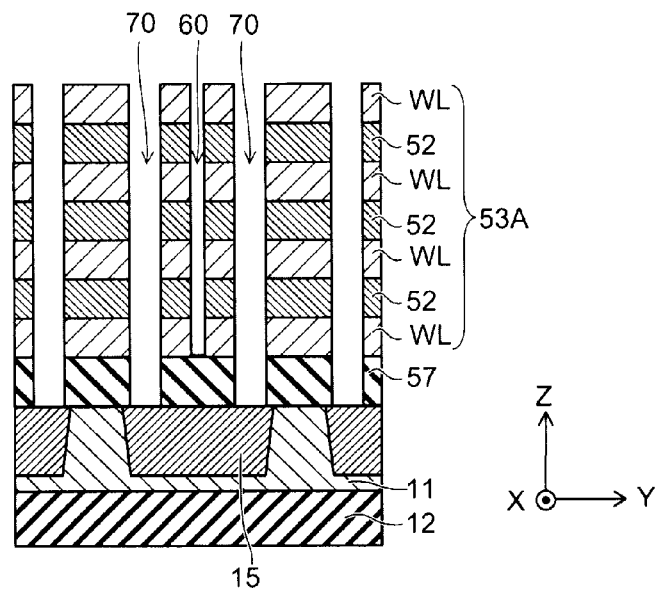

FIG. 8A and FIG. 8B are schematic cross sectional views illustrative of the manufacture process steps of the nonvolatile semiconductor memory device according to the reference sample.

In the reference sample, processes are carried out without providing the aforementioned insulating layer 55. Also in the reference sample, in forming the aforementioned slit 60, it is necessary to prevent a phenomenon (overetch) in which the slit 60 penetrates a sacrificial layer 15 and reaches a semiconductor layer 11. Thus, it is necessary to form an etch stop layer on the sacrificial layer 15 and the semiconductor layer 11.

For example, FIG. 8A shows a state in which an insulating layer 57 for an etch stop layer is provided on the sacrificial layer 15 and the semiconductor layer 11. This insulating layer 57 is also a dielectric layer in general. In order to cause the insulating layer 57 to function as an etch stop layer, it is necessary to increase the film thickness of the insulating layer 57. The effect of the etch stop layer is more increased as the thickness of the insulating layer 57 is made thicker.

FIG. 8B shows a state after a slit 60 and a pair of holes 70 are formed. In the reference sample, the slit 60 and the pair of the holes 70 are formed in separate process steps.

In the reference sample, although the lower ends of the pair of the holes 70 reach the sacrificial layer 15, the lower end of the slit 60 does not reach the sacrificial layer 15 because of the existence of the thick insulating layer 57. Namely, also in the reference sample, the sacrificial layer 15 is not separated by the slit 60.

However, in the reference sample, after forming the pair of the holes 70, the sidewall of the thick insulating layer 57 is exposed in the hole 70. After this exposure, a memory film 30a and a channel body layer 20 are formed in the pair of the holes 70. However, in the reference sample, the length of a memory string MS is elongated by the thickness of the insulating layer 57 as compared with the first embodiment. The insulating layer 57 that is a dielectric layer is brought close to the channel body layer 20.

Thus, in the reference sample, the parasitic resistance of the channel body layer 20 is increased as compared with the parasitic resistance of the channel body layer 20 according to the first embodiment. Therefore, in the reference sample, a cell current carried through the channel body layer 20 is reduced as compared with the first embodiment. Further, a parasitic capacitance is increased because of the existence of the insulating layer 57. This becomes a factor that hinders the high-speed operation (high-speed data read, for example) of the memory string MS. In the reference sample, it is necessary to reduce the thickness of the insulating layer 57 in order to increase a cell current or to reduce a parasitic capacitance. However, the insulating layer 57 does not tend to function as an etch stop layer as the thickness of the insulating layer 57 is made thinner.

On the contrary, in the first embodiment, processes are carried out as the insulating layer 55 is buried in the front surface of the sacrificial layer 15. The insulating layer 55 functions as an etch stop layer in forming the slit 60. The film thickness of the insulating layer 50 formed on the semiconductor layer 11 is thinner than the film thickness of the insulating layer 55.

Thus, in the first embodiment, the parasitic resistance of the channel body layer 20 is reduced as compared with the parasitic resistance of the channel body layer 20 according to the reference sample. As the result, in the first embodiment, it is possible to efficiently externally apply a voltage to the channel body layer 20 and the joining portion 21. Thus, a cell current is increased. Namely, according to the first embodiment, data read is made more stabilized. Further, in the first embodiment, it is possible to operate the memory string MS at high speed because the parasitic capacitance is reduced as compared with the reference sample.

In the first embodiment, the slit 60 to separate the stacked body 53A and the hole 70 for forming the memory hole MH are formed at the same time. In other words, according to the first embodiment, the number of manufacturing process steps is reduced as compared with the reference sample, so that it is possible to reduce manufacturing time and manufacturing costs.

It is noted that in the first embodiment, as for the stacked body 53A illustrated FIG. 5A, an insulating layer may be provided beforehand between the plurality of electrode layers WL instead of the etched layer 52. After completing processes using such a stacked body, the insulating layer instead of the etched layer 52 ensures the insulation between the electrode layers WL provided above and below this insulating layer.

Second Embodiment

Figure 9A:
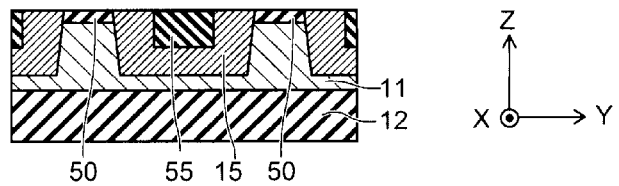
FIG. 9A to FIG. 9C are schematic cross sectional views illustrative of the manufacture process steps of a nonvolatile semiconductor memory device according to a second embodiment.
Figure 9B:
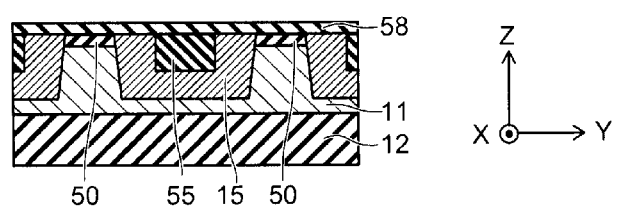
Figure 9C:
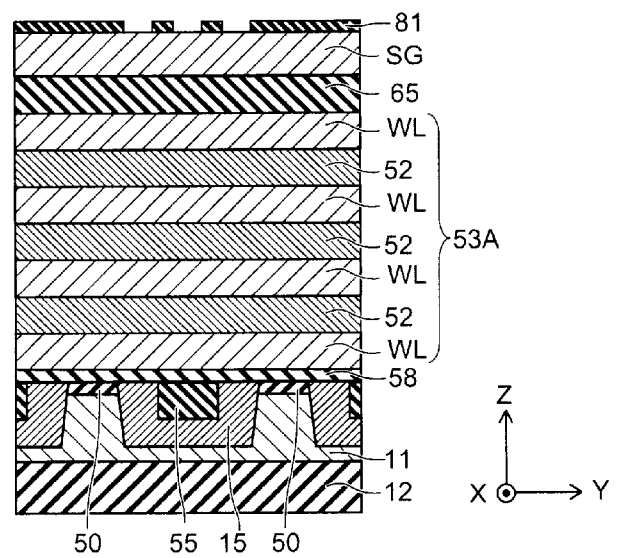

FIG. 9A to FIG. 9C are schematic cross sectional views illustrative of the manufacture process steps of a nonvolatile semiconductor memory device according to a second embodiment.

First, as shown in FIG. 9A, the same state as the state of FIG. 4B is prepared.

Subsequently, as shown in FIG. 9B, an etch stop layer 58 is formed on an insulating layer 50, a sacrificial layer 15, and an insulating layer 55. The material of the etch stop layer 58 is silicon oxide ($SiO_2$).

Subsequently, as shown in FIG. 9C, a stacked body 53A, an interlayer insulating film 65, a select gate SG, and a mask pattern 81 are formed on the insulating layer 50, the sacrificial layer 15, and the insulating layer 55 through the etch stop layer 58. After this formation, processes after FIG. 5B are carried out.

The etch stop layer 58 is provided between the stacked body 53A and the insulating layer 50 and the sacrificial layer 15, so that etching is stopped by the etch stop layer 58 in forming the hole 70 or the slit 60.

Namely, in a region where etching is carried out relatively faster in the surface of a base layer 12, the etch stop layer 58 first stops etching. After stopping etching, etching is carried out in a region where etching is carried out relatively slowly, and the etch stop layer 58 eventually stops etching. As the result, the depth of the hole 70 or the depth of the slit 60 is made more uniform in the surface of the base layer 12 finally processed.

Third Embodiment

In the first embodiment, the slit 60 and the pair of the holes 70 are formed at the same time. However, the slit 60 and the pair of the holes 70 may be formed in separate process steps. The following is one example of this scheme.

FIG. 10A to FIG. 12B are schematic cross sectional views illustrative of the manufacture process steps of a nonvolatile semiconductor memory device according to a third embodiment.

Figure 10A:
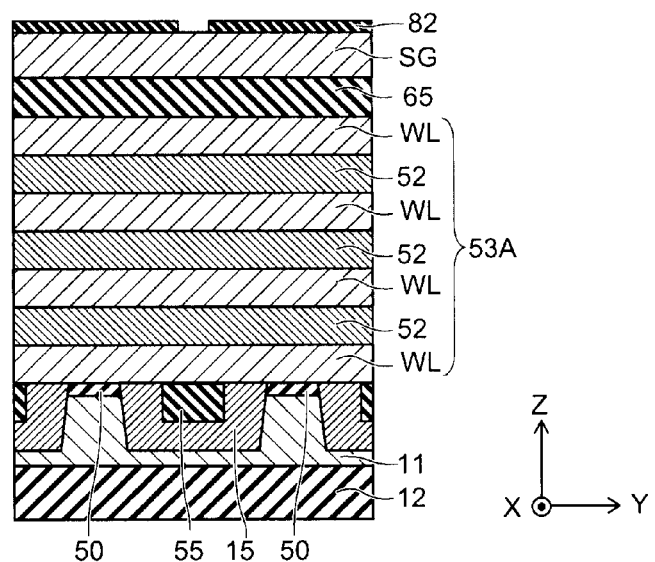
FIG. 10A to FIG. 12B are schematic cross sectional views illustrative of the manufacture process steps of a nonvolatile semiconductor memory device according to a third embodiment.

First, as shown in FIG. 10A, a stacked body 53A including a plurality of electrode layers WL is formed on an insulating layer 50, a sacrificial layer 15, and an insulating layer 55. The stacked body 53A has an etched layer 52 between the plurality of electrode layers WL. An interlayer insulating film 65 is formed on the stacked body 53A, and a select gate SG is formed on the interlayer insulating film 65. Subsequently, a mask pattern 82 formed of a silicon oxide film is formed on the select gate SG.

Figure 10B:
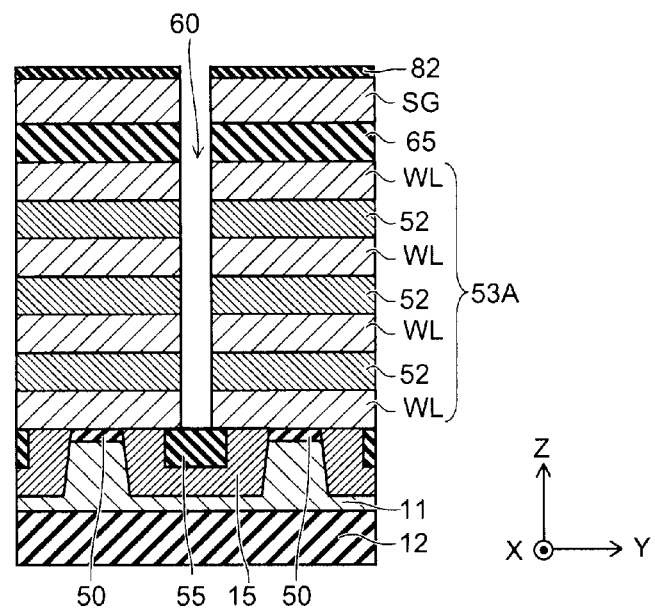

Subsequently, as shown in FIG. 10B, a slit 60 extending in the X-direction and reaching each insulating layer 55 from the front surface of the stacked body 53A is formed. The select gate SG exposed from the mask pattern 82, the interlayer insulating film 65, and the stacked body 53A are removed by dry etching such as RIE, for example, for forming the slit 60.

Figure 11A:
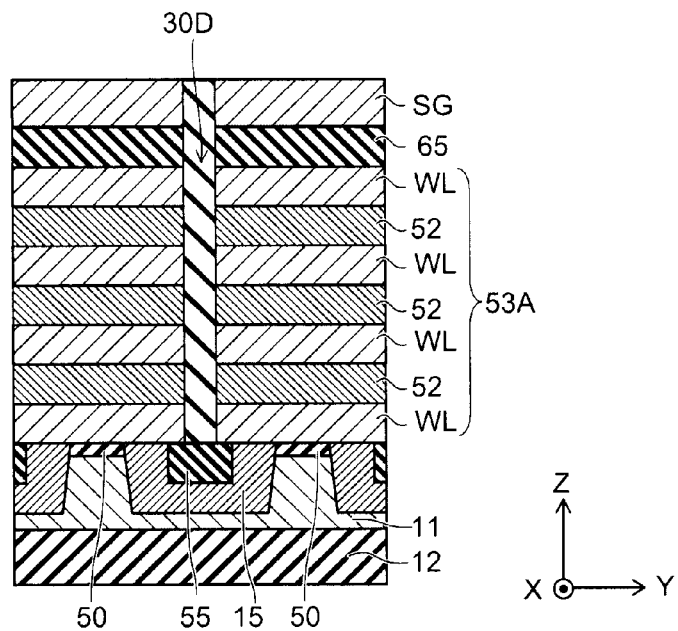

Subsequently, as shown in FIG. 11A, an insulating layer 30D is formed in the slit 60.

Figure 11B:
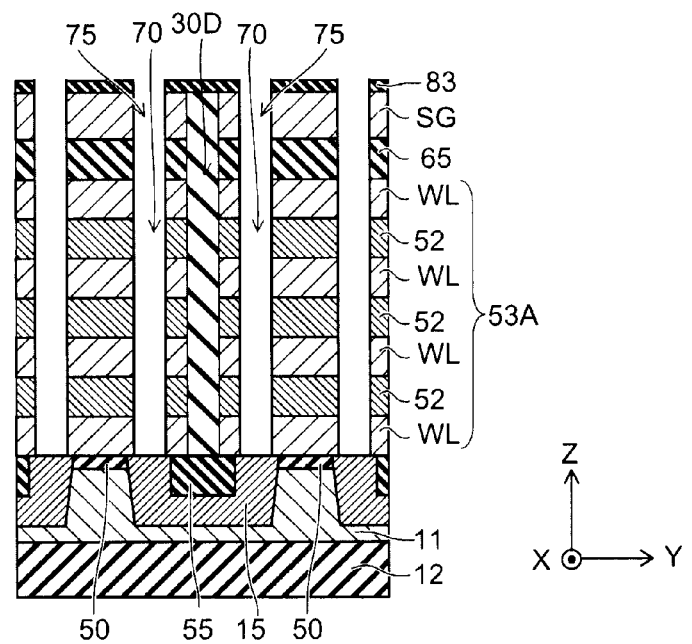

Subsequently, as shown in FIG. 11B, a pair of holes 70 reaching the sacrificial layer 15 from the front surface of the stacked body 53A and a hole 75 connected to each of the pair of the holes 70 are formed.

The select gate SG exposed from a mask pattern 83, the interlayer insulating film 65, and the stacked body 53A are removed by dry etching such as RIE, for example, for forming the pair of the holes 70 and the hole 75 connected to each of the pair of the holes 70 above the stacked body 53A.

Figure 12A:
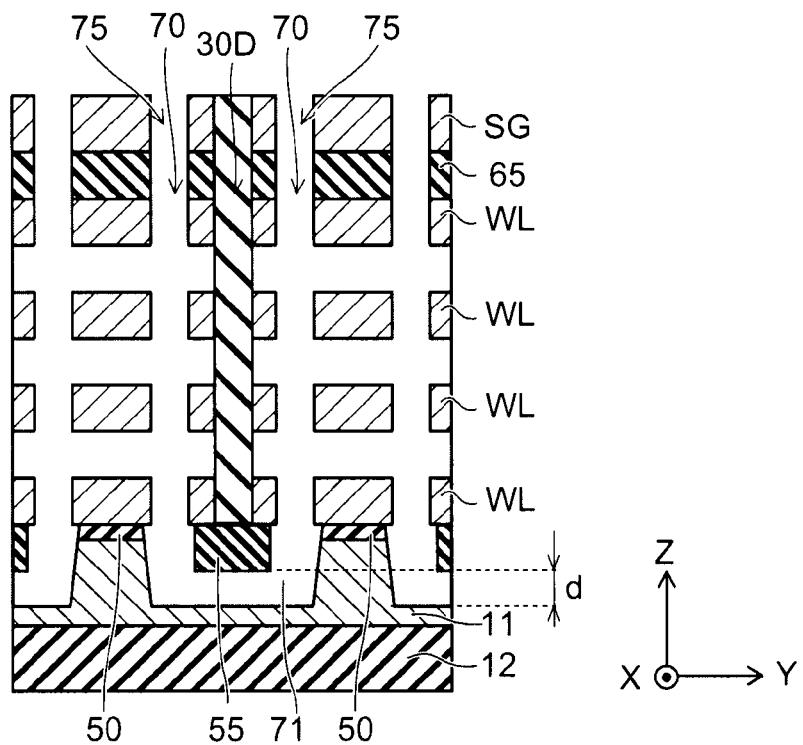

Subsequently, as shown in FIG. 12A, the sacrificial layer 15 and the etched layer 52 are removed through the pair of the holes 70 and the holes 75, and a space 71 connected to the lower end of each of the pair of the holes 70 is formed in a semiconductor layer 11.

Figure 12B:
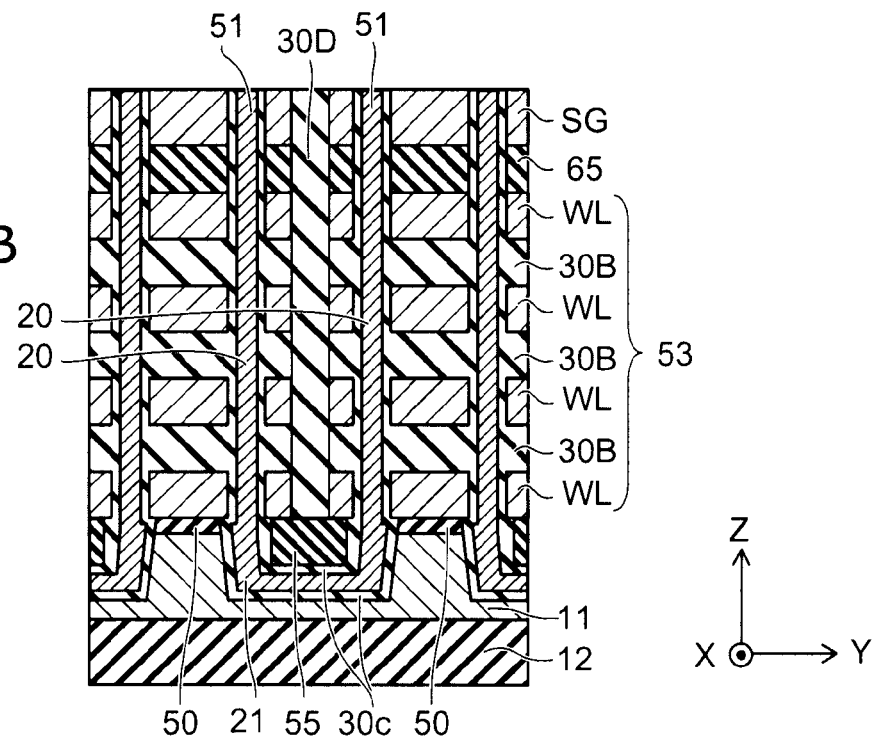

Subsequently, as shown in FIG. 12B, a memory film 30A is formed on the sidewall of each of the pair of the holes 70. An insulating layer 30B is formed between the electrode layers WL. An insulating layer 30C is formed on the inner wall of the space 71.

Subsequently, a channel body layer 20 is formed on the inner side of the memory film 30A formed on the sidewall of each of the pair of the holes 70 and on the inner side of the insulating layer 30C formed on the inner wall of the space 71. On the underside of the stacked body 53, the channel body layer 20 formed on the inner side of the insulating layer 30C is made to be a joining portion 21. At the same time when forming the channel body layer 20, a channel body layer 51 is formed on the inner sides of gate insulating films 35 and 36 formed on the sidewall of each of the holes 75. The channel body layer 20 and the channel body layer 51 are connected to each other.

After this formation, as shown in FIG. 7B, the select gate SG is processed by photolithography and dry etching for forming a drain-side select gate SGD and a source-side select gate SGS. Other members (a contact electrode, an interconnection, or the like) are formed, and thus a nonvolatile semiconductor memory device 1 is formed. The nonvolatile semiconductor memory device 1 is formed also by such manufacture process steps.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nonvolatile semiconductor memory device comprising:
   a substrate;
   an electrode layer provided above the substrate;
   a first insulating layer provided on the electrode layer;
   a stacked body provided on the insulating layer, the stacked body having a plurality of conductive layers and a plurality of insulating film alternately stacked on each other;
   a memory film provided on a sidewall of each of a pair of holes penetrating the stacked body in a direction of stacking the stacked body;
   a channel body layer provided on an inner side of the memory film in each of the pair of the holes;
   a channel body connecting portion formed so as to be buried in the electrode layer and provided so as to join a lower portion in the pair of the holes; and
   a second insulating layer provided between the channel body connecting portion and the stacked body, a film thickness of the second insulating layer being thicker than a film thickness of the first insulating layer.

2. The device according to claim 1, further comprising:
a third insulating layer provided between the channel body connecting portion and the electrode layer and the second insulating layer.

3. The device according to claim 1, further comprising:
a fourth insulating layer sandwiched between the pair of the holes, penetrating the stacked body, and reaching the second insulating layer.

4. The device according to claim 1, further comprising:
an interlayer insulating film provided on the stacked body, the pair of the holes penetrating the interlayer insulating film;
a select gate provided on the interlayer insulating film, the pair of the holes penetrating the select gate; and
a gate insulating film provided on a portion of the select gate on a sidewall of the hole,
the channel body layer being provided also on an inner side of the gate insulating film.

5. The device according to claim 1,
wherein a height of one end of the channel body connecting portion and a height of an other end thereof from a back surface of the electrode layer are almost the same as a height of a top surface of the first insulating layer from the back surface of the electrode layer.

6. The device according to claim 1,
wherein a height of a top surface of the second insulating layer from a back surface of the electrode layer is almost the same as a height of a top surface of the first insulating layer from the back surface of the electrode layer.

7. The device according to claim 1,
wherein the second insulating layer is arranged in multiple numbers in a first direction nearly parallel with a major surface of the electrode layer and in a second direction nearly parallel with the major surface of the electrode layer almost vertical to the first direction.

8. The device according to claim 1,
wherein the second insulating layer extends in the first direction nearly parallel with the major surface of the electrode layer.

9. The device according to claim 3,
wherein the fourth insulating layer extends in the first direction nearly parallel with the major surface of the electrode layer.

10. The device according to claim 1,
wherein materials of the memory film, the insulating film, the third insulating layer, and the fourth insulating layer are a same material.

11. The device according to claim 1,
wherein an etch stop layer containing a silicon oxide is provided on the first insulating layer and the second insulating layer.

* * * * *